United States Patent
Tseng

[11] Patent Number: 5,824,581
[45] Date of Patent: Oct. 20, 1998

[54] METHOD FOR FORMING A DRAM CAPACITOR WITH ROUNDED HORIZONTAL FINS

[75] Inventor: Horng-Huei Tseng, Hsinchu, Taiwan

[73] Assignee: Vanguard International Semiconductor Corporation, Hsinchu, Taiwan

[21] Appl. No.: 738,574

[22] Filed: Oct. 28, 1996

[51] Int. Cl.⁶ ............................................. H01L 21/8242
[52] U.S. Cl. .......................................... 438/253; 438/254
[58] Field of Search .................................. 438/238–241, 438/253–256, 396–397

[56] References Cited

U.S. PATENT DOCUMENTS

| | | | |
|---|---|---|---|
| 5,170,233 | 12/1992 | Liu | 438/397 |
| 5,436,186 | 7/1995 | Hsue et al. | 438/397 |
| 5,545,585 | 8/1996 | Wang et al. | 438/397 |
| 5,550,077 | 8/1996 | Tseng et al. | |
| 5,656,536 | 8/1997 | Wu | 438/397 |

Primary Examiner—Jey Tsai
Attorney, Agent, or Firm—Christensen, O'Connor, Johnson & Kindness PLLC

[57] ABSTRACT

An improved method for forming a dynamic random access memory (DRAM) capacitor includes forming a first dielectric layer on a substrate. The first dielectric layer is patterned and anisotropically etched to form a trench that defines a storage node area. A doped polysilicon layer is formed on the first dielectric layer and filling the trench. Next, a nitride layer is formed on the doped polysilicon layer and a dielectric stack is then formed over the nitride layer. The dielectric stack includes alternating layers of a second dielectric material and a third dielectric material, each dielectric material having a different etch rate. The dielectric stack is patterned and anisotropically etched to form a laminated pillar. The pillar is then isotropically etched to form recessed cavities in a sidewall of the pillar. Portions of the nitride layer are then removed using the pillar as a mask, and a doped polysilicon layer is conformally formed over the pillar so as to fill the recessed cavities. Afterwards, portions of the doped polysilicon layer are removed to expose the upper surface of the pillar, and the pillar is removed while leaving the residual doped polysilicon layer intact, thereby forming an electrode of the capacitor of the DRAM cell.

13 Claims, 7 Drawing Sheets

METHOD FOR FORMING A DRAM CAPACITOR WITH ROUNDED HORIZONTAL FINS

BACKGROUND OF THE INVENTION

1. Field of the Invention

The present invention relates to dynamic random access memory (DRAM) fabrication and, more particularly, to a method for forming a capacitor of a dynamic random access memory cell.

2. Background Art

Recently, demand for semiconductor devices has rapidly increased owing to widespread use of electronic equipment. In particular, the increasing popularity of some electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18, respectively. The row decoder 16 and the column decoder 18 then respectively select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, U.S. Pat. No. 3,387,286 titled "Field Effect Transistor Memory" by R. H. Dennard disclosed a DRAM storage cell structure consisting of one transistor and one capacitor. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows cross section of a traditional one transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size can be reduced, but typically at the cost of further reducing the depth of focus and restricting the flexibility in the design of three-dimensional structures. Accordingly, there is a need for a method of forming a DRAM capacitor with features that are smaller than the minimum feature size of the photolithographic process while increasing the surface area of the capacitor electrodes.

SUMMARY

In accordance with the present invention, a method is provided for forming a DRAM capacitor that substantially increases capacitance, reduces dielectric breakdown and increases the mechanical integrity of a capacitor electrode. In one embodiment, a dielectric layer such as a silicon oxide layer is deposited over the substrate using a conventional low pressure chemical vapor deposition (LPCVD) or plasma enhanced chemical vapor deposition (PECVD) process. The silicon oxide layer is then planarized using any suitable conventional method such as an etch back process or a chemical mechanical polishing (CMP) process. A photoresist layer of minimum dimension (i.e., at the photolithographic limit of the process) is then formed and patterned on the dielectric layer using conventional photolithographic techniques, defining a storage node area over a portion of the source. An anisotropic etching process is then performed, using the photoresist layer as an etching mask. This etching process forms a trench that exposes a portion of the source region.

A doped polysilicon layer is then formed on the dielectric layer so as to fill the trench. The doped polysilicon layer is then planarized using any suitable conventional method such as an etch back process or a CMP process. Then a silicon nitride layer is deposited on the doped polysilicon layer using a conventional LPCVD or PECVD process.

Afterwards, a stack of dielectric layers is formed on the planarized silicon nitride layer. In this embodiment, the first, third and fifth dielectric layers of the stack are formed by a standard LPCVD process using a tetraethylorthosilicate (TEOS) reaction gas without ozone. On the other hand, the second and the fourth dielectric layers of the stack are formed by a chemical vapor deposition (CVD) process using an ozone-TEOS reaction gas. For many etching processes, the second set of dielectric layers (i.e., the second and the fourth dielectric layers) have an etch rate that is faster than the etch rate of the first set of dielectric layers (i.e., the first, third and fifth dielectric layers). Using conventional photolithographic techniques, a photoresist layer is then formed and patterned on the dielectric layer so that the photoresist layer is aligned with the polysilicon filled trench. The photoresist mask is then optionally etched isotropically so that the mask is narrower than the minimum dimension.

An anisotropic etching process, such as an reactive ion etch, is then performed on the dielectric layers using the silicon nitride layer as an etchstop, forming a laminated dielectric pillar on the silicon nitride layer and aligned with the polysilicon filled trench. After the photoresist layer is stripped, the pillar is isotropically etched. Because of the different etch rates for the dielectric layers, this isotropic etching process forms rounded cavities in the second and fourth dielectric layers within the sidewalls of the pillar.

Afterwards, the silicon nitride layer is then etched using the pillar as a mask. A doped polysilicon layer is then formed on the planarized polysilicon layer and the pillar, filling the rounded cavities within the sidewalls of the pillar. The rounded cavities form rounded polysilicon fins that extend into the pillar. These rounded fins are substantially parallel to the surface of the substrate. The doped polysilicon layer is then anisotropiocally etched to expose the dielectric layer.

The dielectric stack and the silicon nitride layer are then removed using HF solution, thereby forming the bottom electrode (or plate) of a DRAM cell capacitor. The rounded fins increase the electrode surface area, thereby increasing the capacitor's capacitance. In addition, the rounded shape of the fins help reduce dielectric breakdown and increase the mechanical integrity of the electrode, compared to conventional fin shapes. The bottom electrode has a very narrow horizontal cross-section, thereby causing the capacitor to occupy a relatively small area of the substrate.

DETAILED DESCRIPTION

Figure 1:
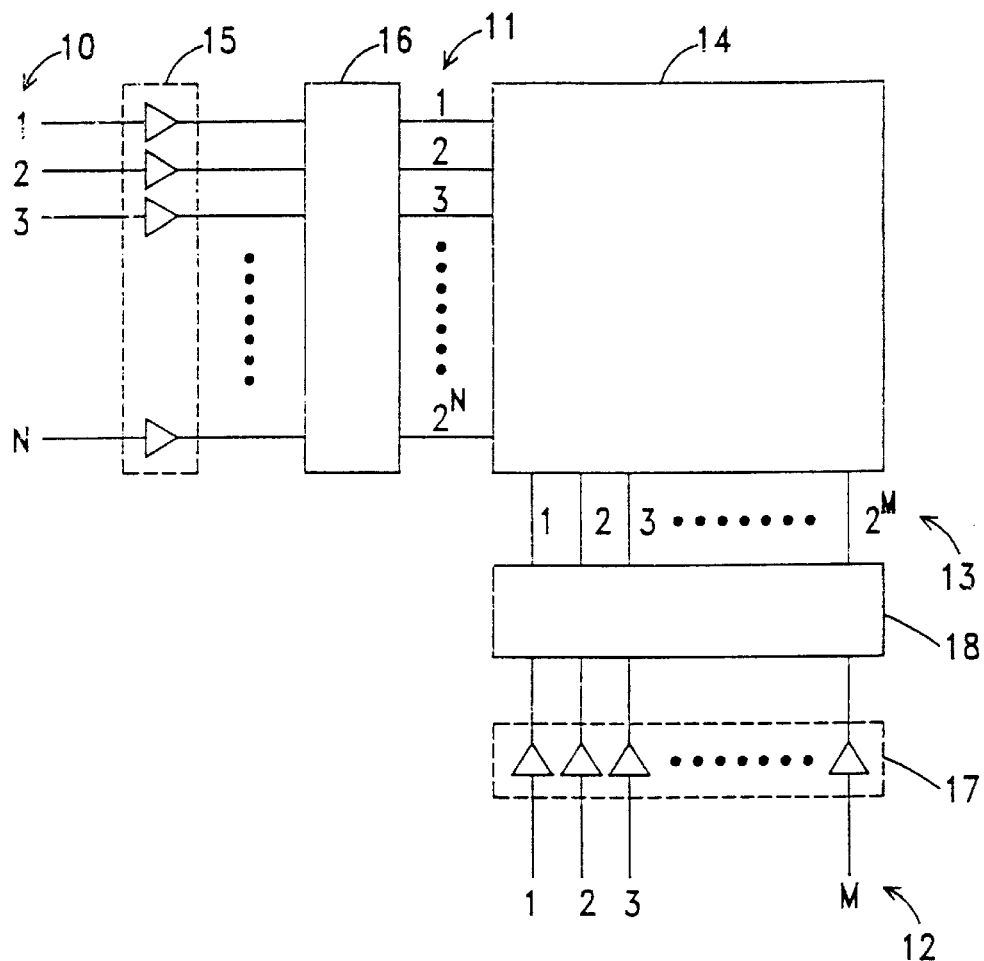
FIG. 1 shows a simplified diagram illustrative of the organization of a typical large semiconductor memory.
Figure 2A:
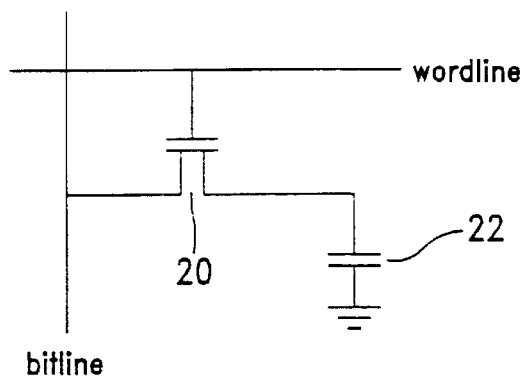
FIG. 2A shows a circuit schematic diagram of a typical one-transistor dynamic random access memory (DRAM) cell.
Figure 2B:
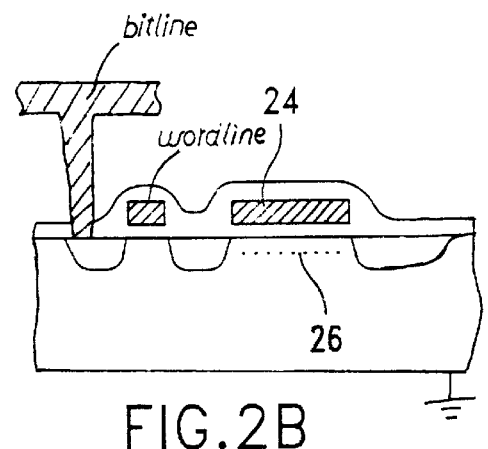
FIG. 2B shows cross-sectional view illustrative of traditional one-transistor DRAM storage cell.
Figure 3:
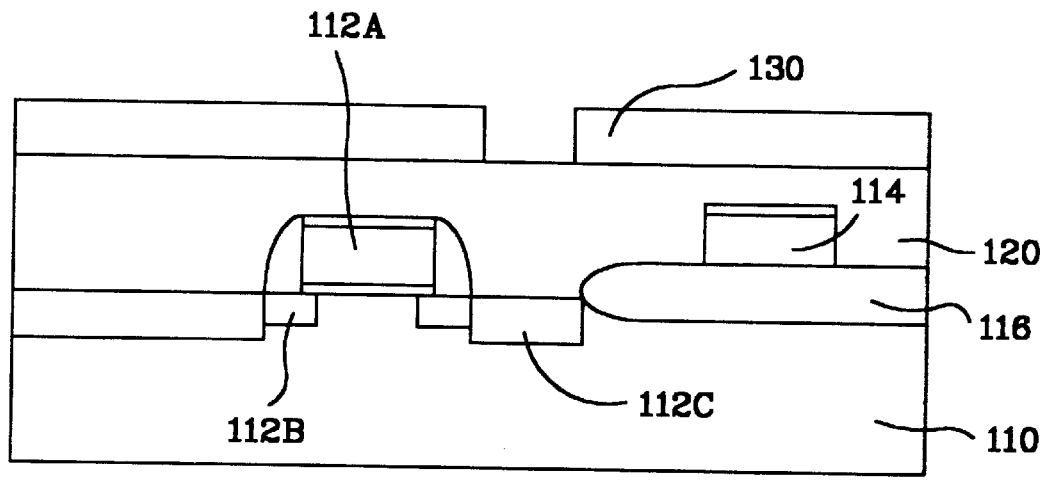
FIGS. 3 to 13 show cross-sectional views illustrative of various stages in the fabrication of a DRAM capacitor in accordance with one embodiment of the present invention.

Referring to FIG. 3, a metal-oxide-semiconductor field effect transistor (MOSFET) having a gate 112A, a drain 112B and a source 112C, is conventionally formed in and on the substrate 110. A field oxide (FOX) region is conventionally formed in the substrate 110 adjacent to the MOSFET for isolation purposes. Further, a word line 114 is formed on the FOX region 116. In this embodiment, the MOSFET is a n-channel MOSFET that forms part of a DRAM cell. A dielectric layer 120, such as a silicon oxide layer, is deposited over the substrate 110 using a conventional low pressure chemical vapor deposition (LPCVD) or plasma enhanced chemical vapor deposition (PECVD) process. The thickness of the silicon oxide layer 120 is about 5000 angstroms, but can range from about 4000 to 8000 angstroms.

Figure 4:
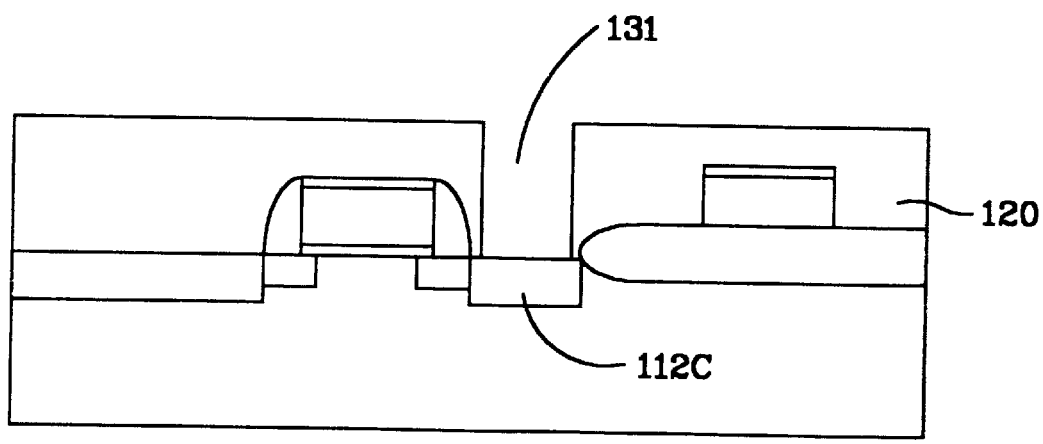

The silicon oxide layer 120 is then planarized using any suitable conventional method such as, for example, an etch back process or a chemical mechanical polishing (CMP) process. A photoresist layer 130 of minimum dimension (i.e., at the photolithographic limit of the process) is then formed and patterned on the dielectric layer 120 using conventional photolithographic techniques, defining a storage node area over a portion of the source 112C. As shown in FIG. 4, an anisotropic etching process is performed, using the photoresist layer 130 as an etching mask. In this embodiment, the etching process uses a heated solution of phosphoric acid, $H_3PO_4$, for etching the oxide layer 120. This etching process forms a trench 131 that exposes a portion of the source region 112C.

Figure 5:
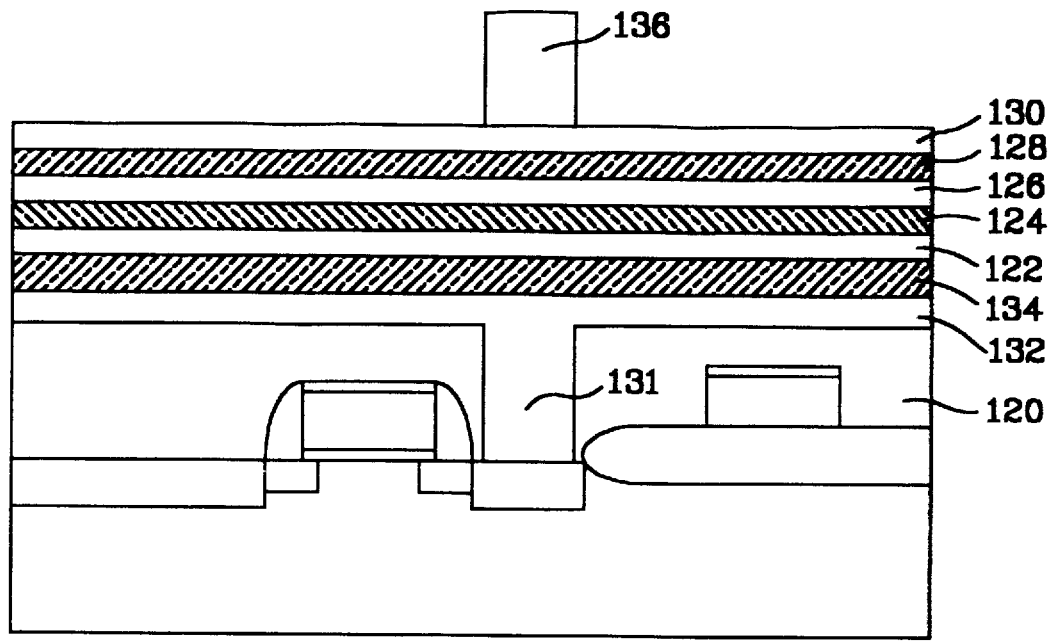

As shown in FIG. 5, a doped polysilicon layer 132 is then formed on the dielectric layer 120 so as to fill the trench 131. In this embodiment, the polysilicon layer 132 is deposited using a standard low pressure chemical vapor deposition (LPCVD) process and is doped with phosphorus dopants at a concentration of about $5E20$ atoms/cm$^3$. After the doped polysilicon layer 132 is planarized using any suitable conventional method (e.g., an etch back process or a CMP process), a silicon nitride layer 134 is deposited on the doped polysilicon layer 132 using a conventional LPCVD or PECVD process. The thickness of the silicon nitride layer 134 is about 500 angstroms, but can range from about 300 to 800 angstroms. It is appreciated that the deposition of the silicon nitride layer 134 is optional in this embodiment.

Afterwards, dielectric layers 122, 124, 126, 128 and 130 are formed on the planarized silicon nitride layer 134. In this embodiment, the dielectric layers 122, 126 and 130 are formed by a standard LPCVD process using tetraethylorthosilicate (TEOS) reaction gas without ozone. The thickness of each dielectric layer is about 200 to 500 angstroms. On the other hand, the dielectric layers 124 and 128 are formed by a CVD process using an ozone-TEOS reaction gas as shown by the reaction equation below:

$$Si(C_2H_5O)_4 + 8O_3 \xrightarrow{SiO_2} + 10H_2O + 8CO_2 \qquad (1)$$

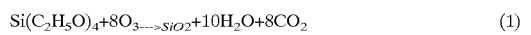

Accordingly, the dielectric layers 122, 124, 126, 128 and 130 form a dielectric stack with alternating layers of dielectric material.

Figure 6:
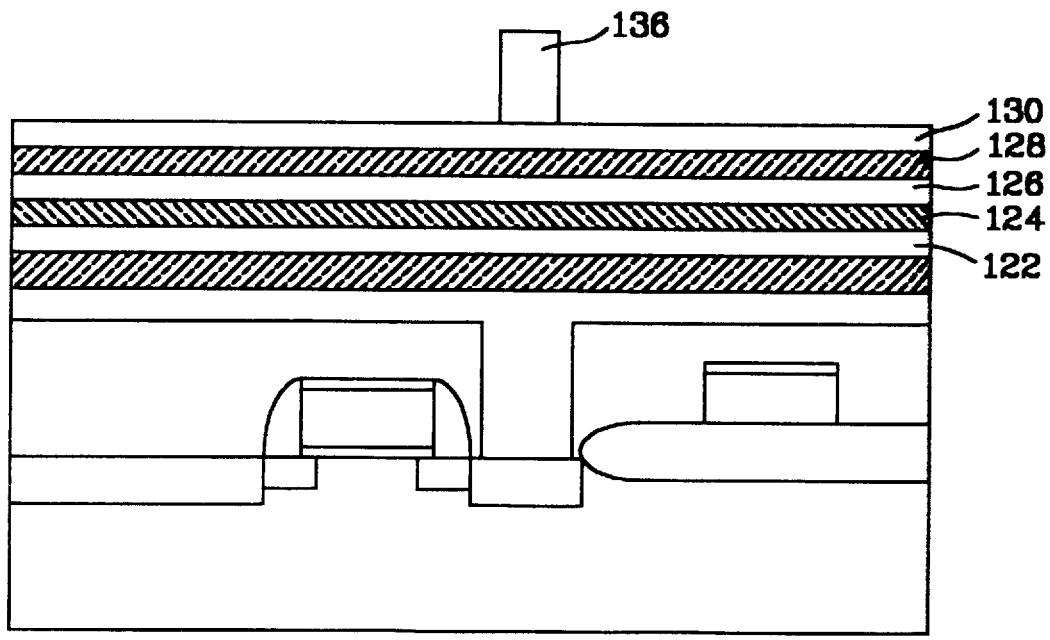

For many etching processes, the second set of dielectric layers (i.e., the dielectric layers 124 and 128) has an etch rate that is faster than the etch rate of the first set of dielectric layers (i.e., the dielectric layers 122, 126 and 130). In accordance with the present invention, this difference in etch rate is advantageously used to fabricate a DRAM cell capacitor, as described below in conjunction with FIG. 8. A photoresist layer 136 is then formed and patterned on the dielectric layer 130 using conventional photolithographic techniques. This photoresist layer 136 is aligned with the polysilicon filled trench 131. In an alternative embodiment, shown in FIG. 6, the photoresist layer 136 is then isotropically etched so that the photoresist layer 136 is narrower than the minimum dimension, therefore achieving a high-density circuit.

Figure 7:
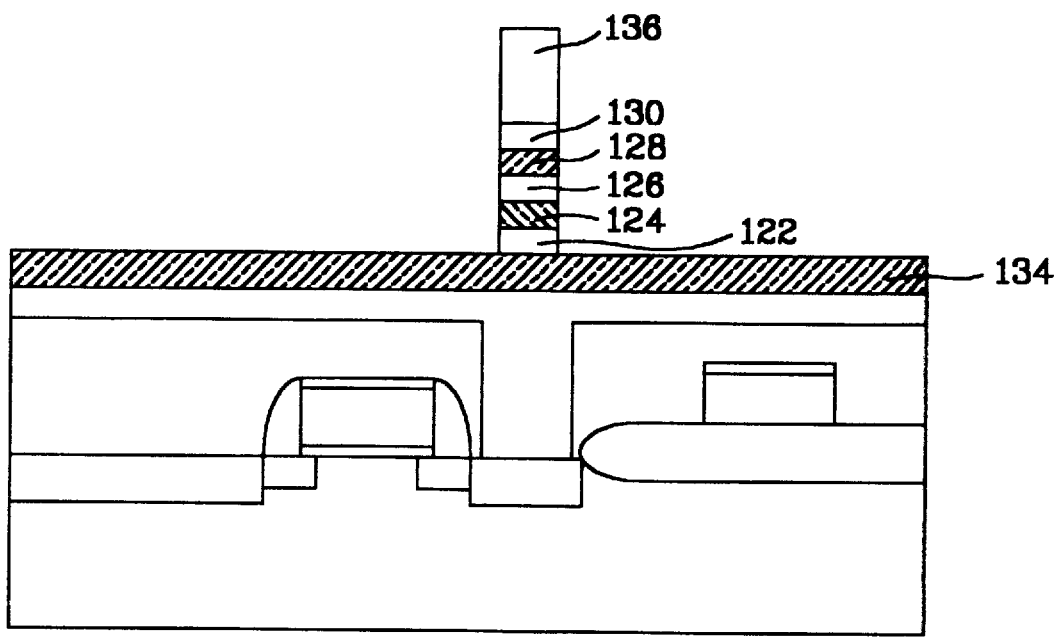
Figure 8:
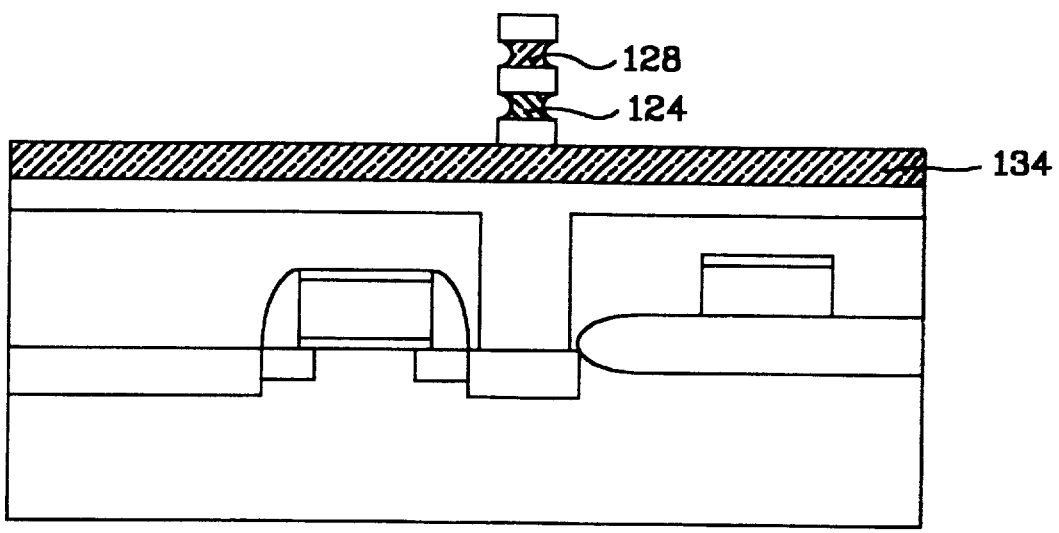

An anisotropic etching process, such as an reactive ion etch (RIE) process, is then performed on the dielectric layers 122, 124, 126, 128 and 130, using the photoresist layer 136 as an etching mask and the silicon nitride layer 134 as an etchstop. The anisotropic etching process forms a laminated dielectric pillar aligned with the polysilicon filled trench, as shown in FIG. 7. After the photoresist layer 136 is stripped, this laminated dielectric pillar is isotropically etched. In this embodiment, the isotropic etching process uses a wet etchant such as HF solution. This etchant etches the dielectric layers 124 and 128 at a rate that is about ten times faster than the etch rate for the dielectric layers 122, 126 and 130. Because of the different etch rates, this isotropic etching process forms rounded cavities in the dielectric layers 124 and 128 within the sidewalls of the pillar, as shown in FIG. 8.

Although oxide materials with different etch rates are used in this embodiment to form the dielectric layers, it is understood that materials other than those described above can be used in other embodiments, provided one set of dielectric layers has an etch rate significantly different from the etch rate of the other set of dielectric layers. Preferably, the etch ratio of the different materials is about 20 to one, or greater. Those skilled in the art of DRAM fabrication will also appreciate that in other embodiments, the number of alternating dielectric layers in the dielectric stack can be varied.

Figure 9:
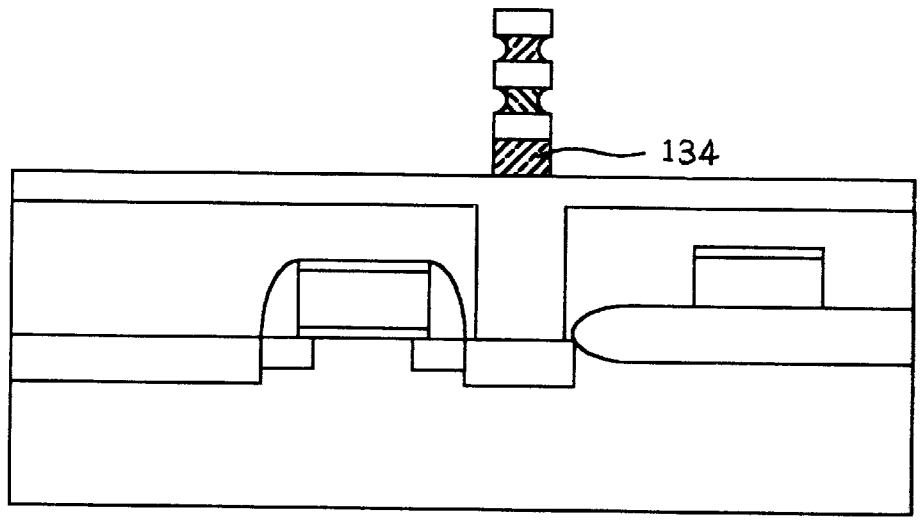

Referring to FIG. 9, the silicon nitride layer 134 is then anisotropically etched using the dielectric pillar as a mask. In this embodiment, the etching process uses a heated solution of phosphoric acid ($H_3PO_4$) for etching the nitride layer 134 while leaving the dielectric pillar intact. After this etching process, the surface of the polysilicon layer 132 is exposed.

Figure 10:
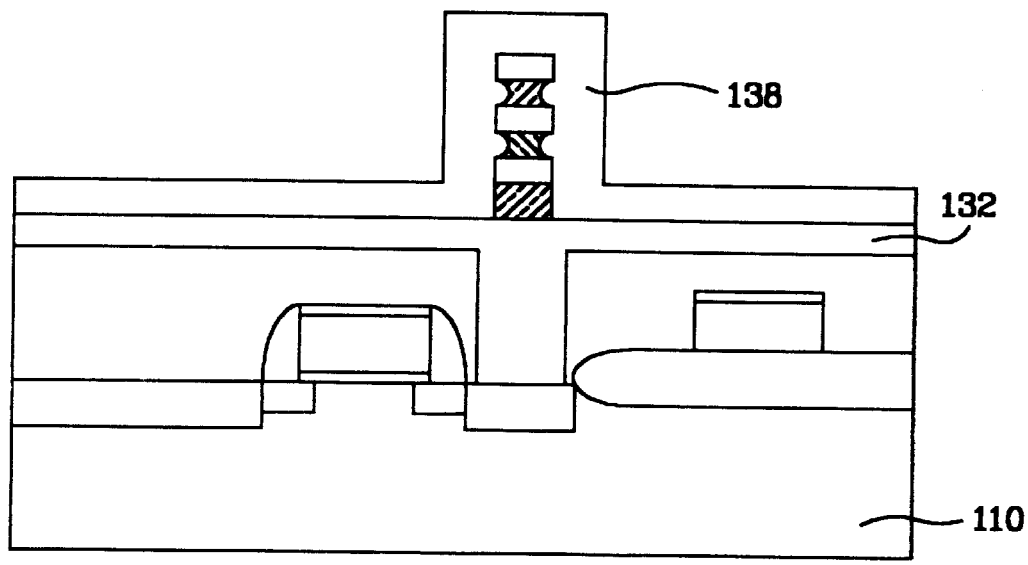

As shown in FIG. 10, a doped polysilicon layer 138 is then formed on the polysilicon layer 132 and the dielectric pillar so as to fill the rounded cavities within the sidewalls of the dielectric pillar. The rounded cavities form rounded polysilicon fins 139 that extend into the dielectric pillar. The rounded fins 139 are substantially parallel to the surface of the substrate 110. In this embodiment, the polysilicon layer 138 is deposited using a standard LPCVD process and is doped with phosphorus dopants at a concentration of about $5E20$ atoms/cm$^3$.

Figure 11:
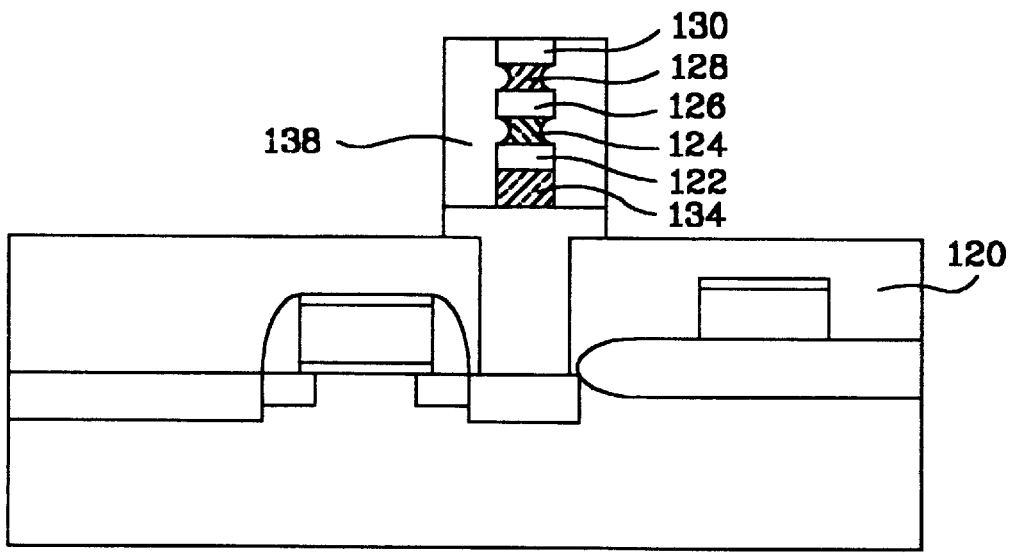

The polysilicon layer 138 is then anisotropiocally etched to expose the dielectric layer 120 as shown in FIG. 11. Because of this anisotropic etching process, the residual portions of the polysilicon layer 138 form a sidewall spacer around the dielectric pillar. In this embodiment, the polysilicon layer 138 is etched using a plasma etch with a $SF_6/O_2$ etchant.

Figure 12:
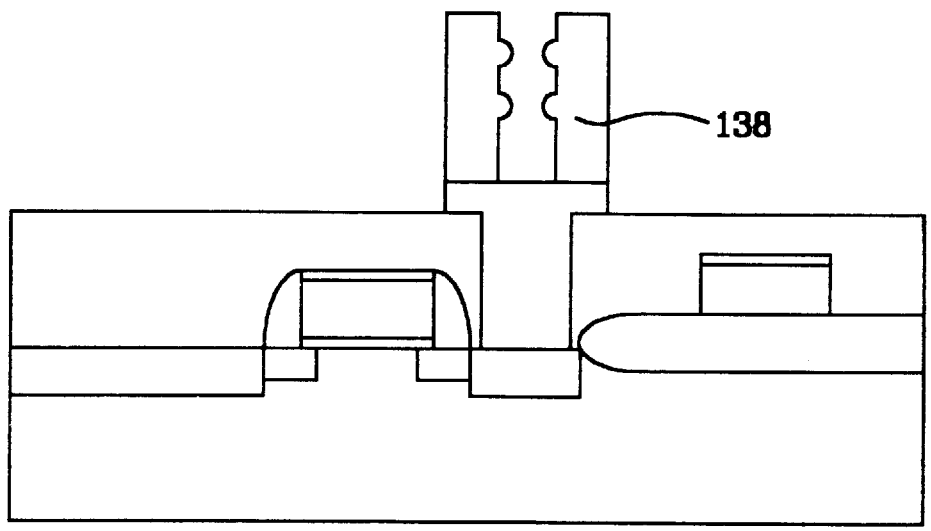

The dielectric layers 122, 124, 126, 128, and 130 and the silicon nitride layer 134 are then removed using HF solution, thereby leaving intact the polysilicon layers 132 and 138. The polysilicon layers 132 and 138 form the bottom electrode (or plate) of a DRAM cell capacitor. The resulting bottom electrode is illustrated in FIG. 12. The rounded fins 139 in the polysilicon layer 138 increase the electrode surface area, thereby increasing the capacitor's capacitance. In addition, compared to conventional fin shapes, the rounded shape of the fins 139 help reduce dielectric breakdown and increase the mechanical integrity of the electrode. The bottom electrode has a very narrow horizontal cross-section of about minimum dimension, thereby causing the capacitor to occupy a relatively small area of the substrate 110.

Figure 13:
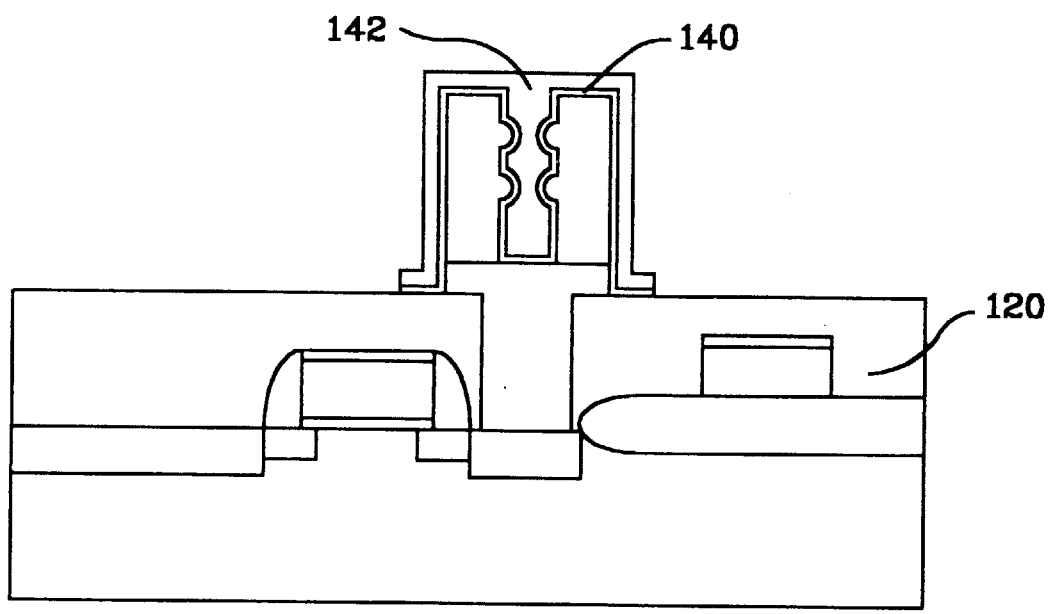

Referring to FIG. 13, the dielectric film 140 and the top electrode 142 of the DRAM cell capacitor can then be formed in the conventional manner. In this embodiment, a thin dielectric layer 140, such as stacked oxide-nitride-oxide (ONO) film, is formed on the exposed surface of the bottom electrode (formed by the polysilicon layers 138 and 132) and a portion of the surface of the dielectric layer 120. As is known in the art of DRAM fabrication, the ONO film is reliable over shaped silicon surfaces, and is typically used as a capacitor insulator. The bottom oxide layer of the stacked oxide-nitride-oxide (ONO) film 140 is conventionally formed by thermally oxidizing the silicon surface, depositing an LPCVD silicon nitride layer and then oxidizing the silicon nitride layer to form the top oxide layer. A conductive layer 142 is then deposited over the stack oxide/silicon nitride/oxide layer 140 to serve as an upper plate of the DRAM cell capacitor. Typically, the conductive layer 142 is a doped polysilicon layer formed in the same manner as the polysilicon layer 138.

Although specific embodiments including the preferred embodiment have been illustrated and described, it will be obvious to those skilled in the art that various modifications may be made without departing from the spirit and scope of the present invention, which is intended to be defined solely by the appended claims.

What is claimed is:

1. A method for forming a capacitor of a dynamic random access memory cell, said method comprising:

forming a first dielectric layer on a substrate;

forming a first photoresist layer on the first dielectric layer, wherein said first photoresist layer defines a storage node area over a portion of said substrate;

removing a portion of the first dielectric layer using the first photoresist layer as a mask, thereby forming a trench in the first dielectric layer;

forming a polysilicon layer on the first dielectric layer so as to fill the trench in the first dielectric layer;

forming a nitride layer on said polysilicon layer;

forming a dielectric stack over said nitride layer, said dielectric stack comprising alternating layers of a second dielectric material and a third dielectric material, the second dielectric material possessing a first etch rate and the third dielectric material possessing a second etch rate, wherein the first etch rate is different from the second etch rate;

forming a second photoresist layer on the dielectric stack, wherein said second photoresist layer is aligned with the trench, said second photoresist layer having a width that is less than or equal to the width of said trench;

isotropically etching the second photoresist layer, thereby narrowing the width of the second photoresist layer;

removing portions of said dielectric stack using the second photoresist layer as a mask, thereby forming a laminated pillar;

removing said second photoresist layer;

isotropically etching said dielectric stack to form recessed cavities in a sidewall of the pillar in said dielectric stack;

removing portions of the nitride layer using the pillar as a mask;

forming a doped polysilicon layer over said dielectric stack, said doped polysilicon layer filling the recessed cavities;

removing portions of said doped polysilicon layer to expose an upper surface of the pillar, thereby forming a sidewall spacer around the pillar, said sidewall spacer having rounded fins extending into the recessed cavities of the pillar; and removing the pillar while leaving the sidewall spacers substantially intact, thereby forming an electrode of the capacitor of the dynamic random access memory cell.

2. The method according to claim 1, wherein said substrate includes a metal-oxide-semiconductor transistor, said metal-oxide-semiconductor transistor being a part of the dynamic random access memory cell.

3. The method according to claim 1, further comprising planarizing said first dielectric layer.

4. The method according to claim 1, wherein said third dielectric material comprises an oxide formed by a thermal chemical vapor deposition method using ozone-tetraethylorthosilicate (TEOS) reaction gas.

5. The method according to claim 4, wherein said dielectric layer possessing the second etch rate is formed by a plasma enhanced chemical vapor deposition method using TEOS reaction gas.

6. The method according to claim 5, wherein said second etch rate is greater than said first etch rate.

7. The method according to claim 6, wherein said recessed cavities are formed in layers of said third dielectric material.

8. The method according to claim 1, wherein said first dielectric layer comprises silicon oxide.

9. The method according to claim 1, wherein said isotropically etching the pillar comprises etching the pillar by a wet etch method using a HF solution etchant.

10. The method according to claim 1, wherein said removing the pillar comprises etching the pillar using a HF solution etchant.

11. The method according to claim 1, wherein said doped polysilicon is formed conformally over the pillar.

12. The method according to claim 11, wherein said removing portions of said doped polysilicon layer comprises anisotropically etching said doped polysilicon layer.

13. The method according to claim 1, wherein said isotropically etched second photoresist layer has a width less than a minimum feature size of a photolithography process.

* * * * *